United States Patent [19]

Kirma

[11] Patent Number: 5,126,507
[45] Date of Patent: Jun. 30, 1992

[54] ARRANGEMENT FOR PROTECTION OF ELECTRICAL INSTALLATIONS AGAINST ELECTRICAL DISTURBANCES

[75] Inventor: Safa Kirma, Wedel, Fed. Rep. of Germany

[73] Assignee: Messerschmitt-Bölkow-Blohm GmbH, Bremen, Fed. Rep. of Germany

[21] Appl. No.: 500,469

[22] Filed: Mar. 28, 1990

[30] Foreign Application Priority Data

May 6, 1989 [DE] Fed. Rep. of Germany ....... 3914929

[51] Int. Cl.⁵ .............................................. H02G 13/00
[52] U.S. Cl. ........................................ 174/2; 174/68.3;
174/72 A; 174/102 R; 174/102 D; 174/35 C; 138/108; 138/127; 138/128
[58] Field of Search ................ 174/2, 6, 35 C, 35 SM, 174/36, 68.3, 71 R, 72 R, 72 A, 101, 102 R, 102 D; 123/143 C, 633; 138/108, 121, 128, 139, 146, 157, 158, 159, 166, 173; 361/216, 218; 439/34, 502, 610, 623

[56] References Cited

U.S. PATENT DOCUMENTS

1,330,811  2/1920  Konigslow, Sr. ............... 174/72 A
4,669,507  6/1987  Moritz ......................... 174/101 X

FOREIGN PATENT DOCUMENTS

1224522  2/1960  France ............................ 174/71 R
881847  11/1961  United Kingdom ............... 174/68.3

OTHER PUBLICATIONS

Boyd, R. E., "Flexible Cable shield", *IBM Technical Disclosure Bulletin*, vol. 9, No. 2, Jul. 1966, pp. 135 and 136.

*Primary Examiner*—Leo P. Picard
*Assistant Examiner*—Bot Lee Ledynh
*Attorney, Agent, or Firm*—Akoo-Toren

[57] ABSTRACT

For protecting electrical installations against electromagnetic interferences and especially against over-voltages as can for instance occur as a consequence of lightning strikes, electrical lines provided between individual electrical apparatus are laid in a flexible hollow tubular member having an electrically conducting surface and at least one separation or division in its longitudinal direction. The hollow member is also provided with an undulated profile. The hollow member can be designed either as divided tubular sections or as cable channels or ducts provided with a covering member.

5 Claims, 3 Drawing Sheets

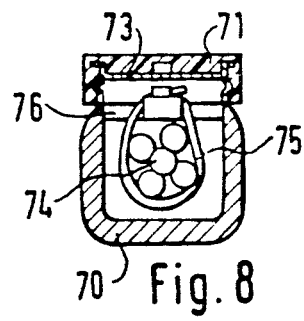
Fig. 8
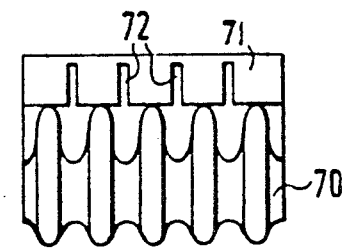
Fig. 9
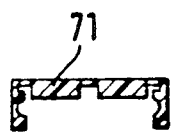
Fig. 10
Fig. 11
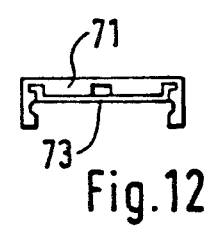
Fig. 12
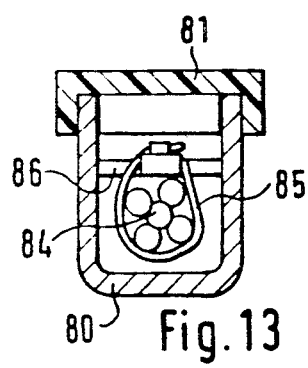
Fig. 13
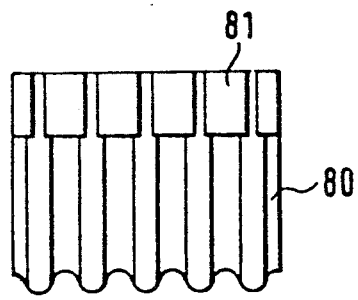
Fig. 14
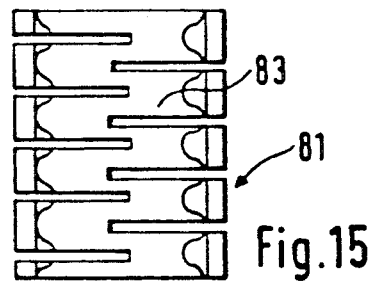
Fig. 15
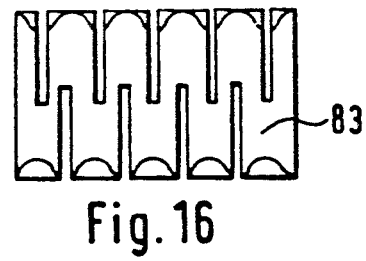
Fig. 16
Fig. 17
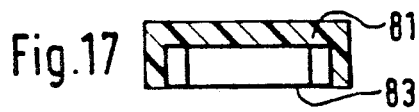
Fig. 18
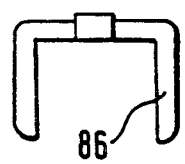
Fig. 19

ARRANGEMENT FOR PROTECTION OF ELECTRICAL INSTALLATIONS AGAINST ELECTRICAL DISTURBANCES

BACKGROUND OF THE INVENTION

The invention is directed to an arrangement for protecting electrical installations against electromagnetic disturbances, especially against excess voltages and the effects of lightning, which arrangement uses metallic shielding which embraces the electrical lines laid between individual electrical apparatus and which is in electrical connection with charge eliminator points.

Arrangements of this type are especially required in aircraft where large quantities of electrical apparatus with very different useful information signals and disturbance sensitivities are arranged in a relatively confined space and where the possibility of mutual interaction must be reliably eliminated; moreover, this electrical equipment is greatly endangered in its safe operation by the effects of a lightning strike on the electronic apparatus. Because of this, an already known method is to equip electrical connecting cables in aircraft, especially complete cable harnesses, with shielding from metallic conducting material, and to connect this shielding respectively at its ends with the housings of the electrical apparatus or with specially provided leads to an electrical ground.

Generally, a hose-shaped braiding consisting of individual metal strands is utilized for this purpose, which is connected with a metallic connector at the cable ends. The connection of this braiding with provided charge elimination points frequently occurs also by means of separate hose-type clamps, which surround the braiding at the cable ends and from which a separate line, which is also designated as a "pig-tail," leads to the charge elimination point.

A disadvantage of such known shielding arrangements is that, because of the free or uncovered areas remaining in the braiding, the penetration of disturbance fields, especially with the high excess voltages occurring in a lightning strike, cannot be reliably eliminated. Furthermore, a problem often occurring with these known devices is that the plug and socket connections used as connector elements for the braiding consist of aluminum materials and tend to corrode, thus entailing malfunctions. Finally, a disadvantage of this known arrangement can be seen in the circumstance that the lines laid inside of such shielding are only accessible with great difficulty from outside in case of a defect, whereby a possibly required repair or replacement of a defective lead involves considerable expense.

SUMMARY OF INVENTION

These disadvantages are substantially overcome, in accordance with a principal feature of the invention, by enclosing the electrical lines within a hollow, generally flexible tube which is divided along its longitudinal direction, and which exhibits an undulating profile. In particular, for further optimization of the protective effect achievable by the inventive arrangement as well as an extensive simplification of its structure and installation, the arrangement of the invention preferably employs flexible hollow conduits having an undulating or wave-shaped profile and which are divided or slotted in the longitudinal direction, and which are made of an electrically conducting material, especially of metal, as electrical shielding. As a result, not only is the required complete protective effect as well as the facilitated accessibility in case of malfunction achieved, but also there results simultaneously in a simple manner the possibility to define the course of individual leads and cable harnesses which have to be laid in a simple manner by means of molded parts fixed to the hoses or conduits at appropriate points. Furthermore, this measure provided in the invention enables a particularly simple realizable transition between the shielding and connector plugs arranged at the cable ends as well as simple installation of branches into the cable harnesses. In addition, the shielding in the invention has a high mechanical stability or rigidity because of the structured design of the hollow conduits, which at the same time makes possible considerable weight saving.

BRIEF DESCRIPTION OF THE DRAWINGS

The invention will now be explained with particularity in connection with several embodiments thereof in conjunction with the accompanying drawings, wherein:

FIGS 8–12 show a fourth embodiment in cross-section, in side view, as well as a bracket design for receiving cable bundles;

FIGS. 13–19 show a fifth embodiment in cross-section, in side view, as well as bracket designs for receiving cable bundles.

DETAILED DESCRIPTION OF PREFERRED EMBODIMENTS

Figure 1:
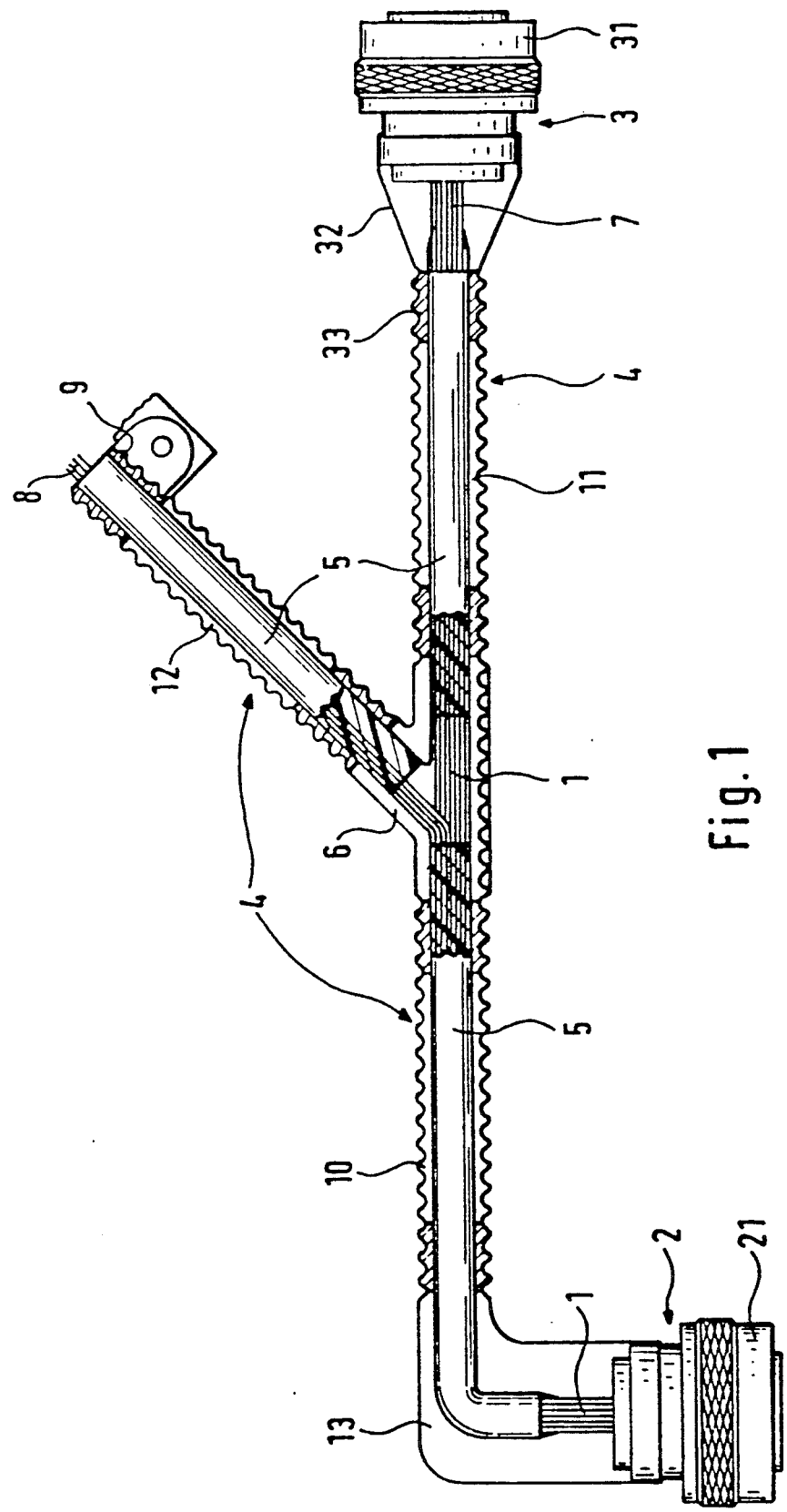
FIG. 1 is a basic illustration of branched, hollow conduits, partially in section, of a preferred embodiment in accordance with the invention.

In the shortened arrangement shown in FIG. 1 to illustrate the invention, there is shown a cable harness 1, comprising a plurality of electrical lines grouped into a bundle, which in a typical case would be laid inside an aircraft between components of electrical equipment (not shown here). The junction of the cable harness 1 with these apparatus occurs respectively by means of multiple plug and socket connections of which the connector elements 2, 3 are shown arranged at the ends.

In order to protect against electromagnetic interference, principally against over-voltages as can arise especially as a consequence of lightning strikes, the cable harness 1 is covered by shielding consisting of a flexible metal tube 4 divided in its longitudinal direction; this metal tube has an undulated profile or is corrugated. Only the lower portion of this is shown in the drawing where the cable branch occurs, which in addition has been shown cut open below the branching point to the upper portion acting as a covering jacket in order to show the cable 1 inside. In addition, the cable bundle 1 is covered by a plastic braiding 5 located inside of the hollow tube 4, which braid constitutes a protection against possible chafing or other mechanical loads.

As can be seen from the illustration in FIG. 1, the cable harness 1 is subdivided at a branch-out element 6 into two partial cable sections 7, 8 which run in separate directions, of which the partial section 8 is only partially shown in the drawing because it passes at this point through a separation not shown in the drawing. An additional junction element 9 is arranged at this point, which serves as a connection to ground or the plane fuselage as well as for attaching the partial tube 8.

The hollow tube 4 is composed of several partial elements 10-12 in its longitudinal direction. A molded part 13 is provided at the left end of the drawing of the partial element 10 of the tubular shielding, which molded part 13 transits into the connector element 2 by means of which the cable harness 1 is redirected through 90°. The two junction elements 2 and 3 are multi-pole round plug connectors, which can be latched to an apparatus socket (not shown here) by means of a coupling ring nut 21 or 31. The junction element 3 has a housing 32 connected with a two-part bush 33. This bush 33 has the same undulated profile on its outer side as the partial element 11 of the hollow tube 4 and is connected with it in a positively locking manner. The same positively locking connection exists also between the branch element 6 and the three partial elements 10-12 as well as between the junction element 9 and the partial element 12 of the hollow tube 4.

In the following description, we provide details of the construction of the flexible shielding tube 4 which in this case also consists of metal, preferably nickel, but can be equally well fabricated at least partially out of plastics material.

Figure 2:
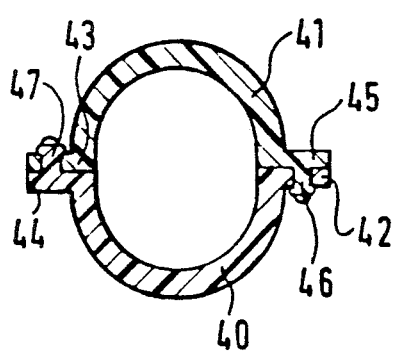
FIGS. 2 and 3 show variations of an arrangement of the invention in cross-section.
Figure 3:
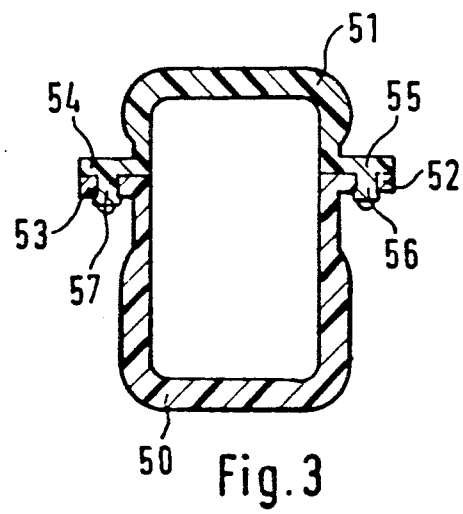
Figure 4:
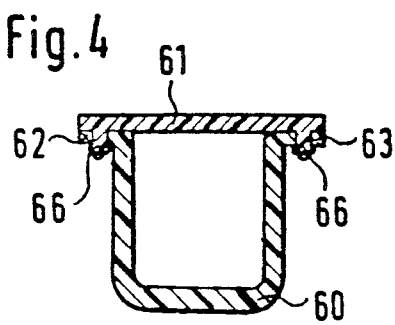
FIGS. 4–7 show a third embodiment in cross-section, in side view as well as in two plan views.
Figure 5:
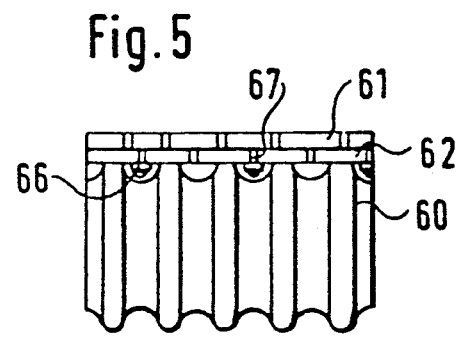
Figure 6:
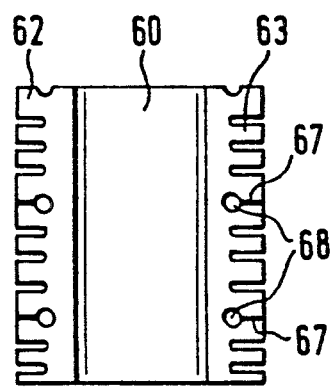
Figure 7:
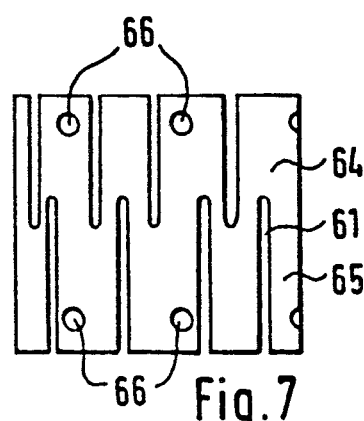

In FIGS. 2 and 3, cross-sections through tubes with an undulated profile serving as a shielding jacket in accordance with the invention are shown. The tube in FIG. 2 consists of two identically formed halves 40 and 41 which are respectively provided with webs 42-45. The webs 44 and 45 are herein provided with knobs 46 and 47 at regular intervals which engage through corresponding bores and connect detachably as a snap-in connection the two halves 40 and 41 with each other. In this embodiment, the tube will have a circular cross section.

In the design in FIG. 3, the tube has an approximately rectangular cross-section. In this case, furthermore, the two halves 50 and 51 are made to have different depths, with the lower half 50 serving as a cable duct for receiving a cable harness or bundle not shown here, while the upper half 51 constitutes a covering member. In this case also a detachable snap-in connection between the two halves 50 and 51 is provided by means of knobs 56 and 57 arranged on webs 52-55, the webs 52 and 53 having holes or receptacles to receive the knobs. The resultant tube is provided with an undulated profile and, as shown in FIGS. 2 and 3, consists in this case of a metallized, such as nickel plated, plastic material.

In the embodiment shown in FIGS. 4-7, the hollow tube serving for the shielding is designed similar to a cable channel or duct, meaning that it consists of a U-shaped lower partial element 60 and a flat covering 61, which is designed to be sufficiently wide to rest on webs 62, 63 on the side of the partial element 60. The covering 61 engages, with the two projections 64 and 65 extending in a longitudinal direction (FIG. 7), into apertures of the partial element 60, at the same time engaging with its knobs 66 into bores 68 (FIG. 6) provided with a side slot 67 in the webs 62 and 63. In this case also, the two partial elements 60 and 61 forming the hollow tube can consist either of metal or of metallized plastic material. This can be seen especially in the side view of FIG. 5 of the tube as the undulated profile in this case extends only upon the lower partial element 60 and not into the cover 61.

In the previously named figures, arrangements including shielding are respectively shown where the cable harness located on the inside was protected preferably by a plastic braid (5 in FIG. 1) embracing same against mechanical stress, especially against chafing at the inner walls of the profiled hollow tube. In case of repairs, this requires the additional work step involving cutting open the plastic braid, and after repair has been accomplished, it must be closed again by suitably splicing. The embodiments shown in FIGS. 8-19 avoid this additional work step by fixing or mounting the cable harness at periodic spacings inside of the hollow tube.

The arrangement shown in FIGS. 8-12 shows again a cable channel or conduit, comprising a U-shaped lower partial element 70 provided with an undulated profile as well as a covering 71 which projects beyond appropriately formed extensions of the lower partial element 70 and which closes off said partial element 70. While the lower partial element 70 in this case consists again of metal or metallized plastic, the covering 71 is fabricated out of simple plastic material and is provided with slots 72 on the sides. A continuous metal rail 73 is inserted into the covering 71 which, when the cable channel is closed, is in electrical contact with the lower partial element: this provides a completely closed shielding effect against electromagnetic interferences or overvoltages. As can be furthermore seen from the cross-sectional illustration in FIG. 8, a cable bundle or harness 74 laid inside of the cable channel is attached by means of cable ties 75 at brackets 76 inserted at periodic spacings into the lower partial element 70, these brackets 76 having the same shape as the bracket 86 in FIG. 19 and being placed from the top into one of the wave-shaped depressions of the partial element 70 to whose outer form it is adapted. FIGS. 10-12 show various elements separately to assist in understanding their construction.

The embodiment shown in FIGS. 13-19 represents a variant of the previously described example. Here also a lower partial element 80 of metal or metallized plastic as well as a plastic covering 81 form together a cable channel or duct, into which a cable bundle 84 is suspended at brackets 86 by means of cable ties 85. In the case of this example, the wave-shaped or undulated profile of the lower partial element 80 has been extended upward to its upper edge (FIG. 14).

A metal rail 83 is provided also in this example which is inserted into the covering 81 and which forms a closed shielding together with the lower partial element 80. It is designed to be U-shaped in this case, wherein the legs comprise also an undulated profile. This is discernible from the detailed illustration in FIGS. 15 and 16. FIGS. 17 and 18 show that the width of the rail 83 is selected in such a way that it precisely fits into the also U-shaped covering 81.

The plastic bracket 86 shown in FIG. 19 has rounded legs with which it can also be accurately inserted into the inside of the wave or undulated profile of the lower partial element 80. The cable bundle or harness 84 suspended at this bracket 86 is in this manner protected against any type of contact, and thus against chafing and wear, at the walls of the cable channel. The term "arrangement" generally as used herein and in the claims means, as illustrated in FIG. 1, the assembly of electrical lines 1, braiding 5, metal tube 4, and connectors 2, 3 at the ends.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. An arrangement for interconnecting electrical apparatus for protecting same against electromagnetic interference due to over-voltages and lightning effects, said arrangement comprising a plurality of electrical lines for connecting individual electrical apparatus, a hollow elongated generally tubular member surrounding the electrical lines along substantially their entire length, said tubular member having an electrically conducting surface forming electrical shielding of the lines and being fully divided and fully separable into two halves in its longitudinal direction, said tubular member having an undulated profile and being flexible, one of the two halves having spaced plug connections integral with and extending along at least one of its longitudinal edges, the other of the two halves having spaced receptacle connections integral with and extending along at least one of its longitudinal edges, said plug and receptacle connections being locatable opposite to one another when the two halves are assembled, said plug and receptacle connections forming detachable snap-in fasteners for assembling and disassembling said two tubular member halves.

2. An arrangement according to claim 1, wherein the hollow tubular member comprises metallized plastic material.

3. An arrangement according to claim 1, wherein the hollow tubular member comprises a generally U-shaped cable conduit constituting one of the two halves, and a cover member for the conduit constituting the other of the two halves.

4. An arrangement according to claim 1, wherein the plug connections are all on one tubular member halve, and the receptacle connections are all on the other tubular member halve.

5. An arrangement according to claim 1, wherein the plug connections are along one side only of one tubular member halve, and the receptacle connections are along one side only of the other tubular member halve.

* * * * *